United States Patent
Chuang et al.

(10) Patent No.: US 12,191,261 B2
(45) Date of Patent: Jan. 7, 2025

(54) SEMICONDUCTOR DEVICE INCLUDING ELECTROMAGNETIC INTERFERENCE (EMI) SHIELDING AND METHOD OF MANUFACTURE

(71) Applicant: Taiwan Semiconductor Manufacturing Co., Ltd., Hsinchu (TW)

(72) Inventors: Po-Yao Chuang, Hsinchu (TW); Meng-Wei Chou, Zhubei (TW); Shin-Puu Jeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/870,338

(22) Filed: Jul. 21, 2022

(65) Prior Publication Data
US 2022/0359421 A1    Nov. 10, 2022

Related U.S. Application Data

(62) Division of application No. 16/899,980, filed on Jun. 12, 2020.

(Continued)

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/4857* (2013.01); *H01L 21/565* (2013.01); *H01L 23/3128* (2013.01); *H01L 23/49822* (2013.01); *H01L 23/49838* (2013.01); *H01L 24/16* (2013.01); *H01L 2224/16227* (2013.01); *H01L 2924/3025* (2013.01)

(58) Field of Classification Search
CPC .............. H01L 23/552; H01L 21/4853; H01L 21/4857; H01L 21/565; H01L 23/3128; H01L 23/49822; H01L 23/49838; H01L 24/16; H01L 2224/16227; H01L 2924/3025
USPC ........................................................ 257/659
See application file for complete search history.

(56) References Cited

U.S. PATENT DOCUMENTS 9,633,934 B2    4/2017    Lin et al.
9,842,826 B2    12/2017   Lin et al.
(Continued)

FOREIGN PATENT DOCUMENTS

| CN | 106206530 A | 12/2016 |
| CN | 106356340 A | 1/2017 |
| CN | 109585309 A | 4/2019 |

*Primary Examiner* — Didarul A Mazumder
(74) *Attorney, Agent, or Firm* — Slater Matsil, LLP

(57) ABSTRACT

Semiconductor devices and method of manufacture are provided. In embodiments a conductive connector is utilized to provide an electrical connection between a substrate and an overlying shield. The conductive connector is placed on the substrate and encapsulated with an encapsulant. Once encapsulated, an opening is formed through the encapsulant to expose a portion of the conductive connector. The shield is deposited through the encapsulant to make an electrical connection to the conductive connector.

20 Claims, 13 Drawing Sheets

Related U.S. Application Data

(60) Provisional application No. 63/001,923, filed on Mar. 30, 2020.

(51) Int. Cl.
*H01L 21/56* (2006.01)
*H01L 23/00* (2006.01)
*H01L 23/31* (2006.01)
*H01L 23/498* (2006.01)

(56) References Cited

U.S. PATENT DOCUMENTS

| | | | |
|---|---|---|---|
| 10,276,511 B1* | 4/2019 | Tsai | H01L 23/16 |
| 10,790,244 B2 | 9/2020 | Huang et al. | |
| 2004/0203181 A1 | 10/2004 | Shang et al. | |
| 2006/0088992 A1* | 4/2006 | Huang | H01L 24/05 |
| | | | 257/E23.021 |
| 2010/0276792 A1 | 11/2010 | Chi et al. | |
| 2012/0228749 A1 | 9/2012 | Pagaila | |
| 2012/0320559 A1 | 12/2012 | Kimura | |
| 2015/0043189 A1* | 2/2015 | Kitazaki | H05K 3/244 |
| | | | 29/832 |
| 2016/0093576 A1 | 3/2016 | Chiu et al. | |
| 2017/0133326 A1 | 5/2017 | Dang et al. | |
| 2017/0141059 A1* | 5/2017 | Shih | H01L 24/11 |
| 2017/0221859 A1 | 8/2017 | Chen et al. | |
| 2018/0269181 A1* | 9/2018 | Yang | H01L 25/0652 |
| 2018/0277489 A1* | 9/2018 | Han | H01L 24/82 |
| 2018/0342465 A1 | 11/2018 | Han et al. | |
| 2019/0051611 A1* | 2/2019 | Kim | H01L 23/3128 |
| 2019/0304926 A1 | 10/2019 | Ryu et al. | |
| 2019/0393162 A1* | 12/2019 | Jun | H01L 23/3121 |
| 2020/0043866 A1 | 2/2020 | Fujii et al. | |

\* cited by examiner

SEMICONDUCTOR DEVICE INCLUDING ELECTROMAGNETIC INTERFERENCE (EMI) SHIELDING AND METHOD OF MANUFACTURE

PRIORITY CLAIM AND CROSS-REFERENCE

This application is a division of U.S. patent application Ser. No. 16/899,980, filed on Jun. 12, 2020, entitled "Semiconductor Device Including Electromagnetic Interference (EMI) Shielding and Method of Manufacture," which claims the benefit of U.S. Provisional Application No. 63/001,923, filed on Mar. 30, 2020, which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, bonded semiconductor devices have emerged as an effective alternative to further reduce the physical size of a semiconductor device. In such devices active circuits such as logic, memory, processor circuits and the like are fabricated at least partially on separate substrates and then electrically connected together in order to form a functional device. Such connection processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
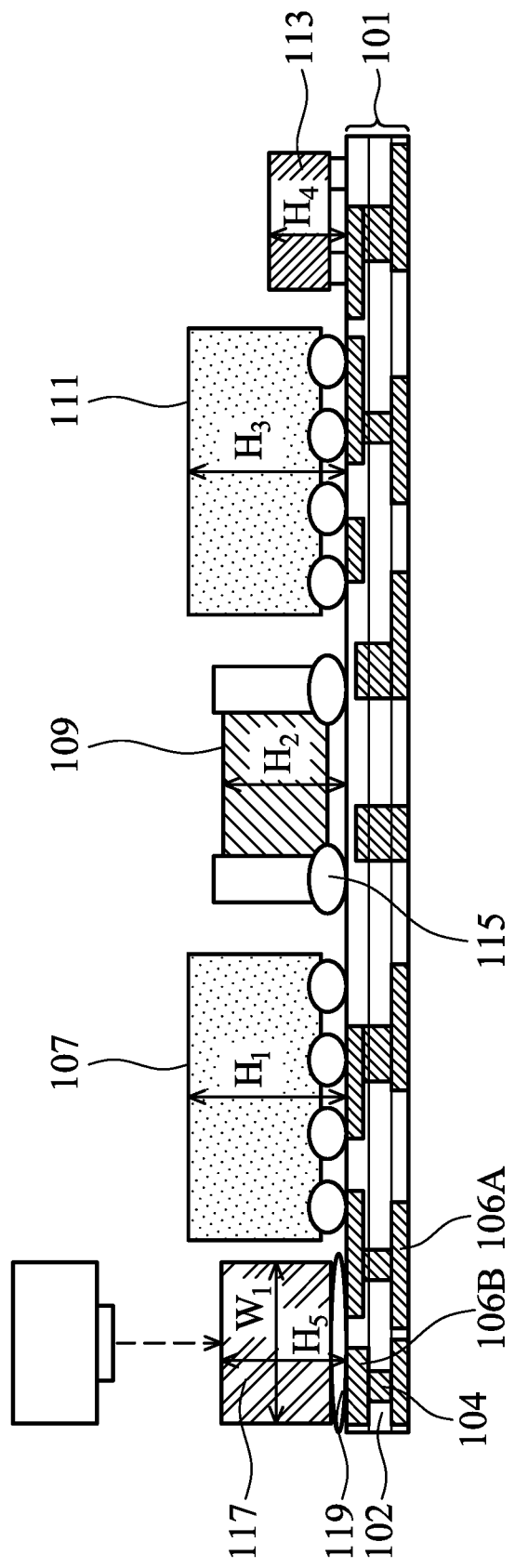
FIG. 1 illustrates placement of a conductive connector in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment which provides EMI shielding for integrated circuit packages. Embodiments, however, can be implemented in a wide variety of ways, and are not intended to be limited to the precise embodiments described herein.

With reference now to FIG. 1, there is illustrated a first substrate 101 upon which a first module 107, a second module 109, a third module 111, and a fourth module 113 have been attached. In an embodiment the first substrate 101 may be an interposer substrate such as an organic substrate, a ceramic substrate, a silicon substrate, or the like.

In preparation for attachment of the modules (e.g., the first module 107, the second module 109, the third module 111, and the fourth module 113), the first substrate 101 may be processed according to applicable manufacturing processes to form redistribution structures in the first substrate 101. For example, the first substrate 101 includes a substrate core 102. The substrate core 102 may be formed of glass fiber, resin, filler, other materials, and/or combinations thereof. The substrate core 102 may be formed of organic and/or inorganic materials. In some embodiments, the substrate core 102 includes one or more passive components (not shown) embedded inside. In another embodiment, the substrate core 102 may comprise other materials or components.

Conductive vias 104 are formed extending through the substrate core 102. The conductive vias 104 comprise a conductive material such as copper, a copper alloy, or other conductors, and may include a barrier layer, liner, seed layer, and/or a fill material, in some embodiments. The conductive vias 104 provide vertical electrical connections from one side of the substrate core 102 to the other side of the substrate core 102. For example, some of the conductive vias 104 are coupled between conductive features at one side of the substrate core 102 and conductive features at an opposite side of the substrate core 102. Holes for the conductive vias 104 may be formed using a drilling process, photolithography techniques, a laser process, or other methods, as examples, and the holes of the conductive vias 104 are then filled with conductive material. In some embodiments, the conductive vias 104 are hollow conductive through vias having centers that are filled with an insulating material.

Once the conductive vias 104 have been formed, redistribution structures 106A and 106B are formed on opposing sides of the substrate core 102. The redistribution structures 106A and 106B are electrically coupled by the conductive vias 104, and fan-out electrical signals. The redistribution structures 106A and 106B each include dielectric layers and metallization patterns. Each respective metallization pattern has line portions on and extend along the major surface of a respective dielectric layer, and has via portions extending through the respective dielectric layer.

In another embodiment the first substrate 101, instead of being an interposer substrate, may be a first redistribution layer. In an embodiment the first redistribution layer comprises a series of conductive layers (such as two or three conductive layers) embedded within a series of dielectric layers (such as three or four dielectric layers) that are utilized to provide not only conductive routing for signals, but which may also be utilized to provide structures such as integrated inductors or capacitors. In an embodiment, a first one of the series of dielectric layers is formed over, for example, a support substrate (not separately illustrated in FIG. 1), and the first one of the series of dielectric layers may be a material such as polybenzoxazole (PBO), although any suitable material, such as polyimide or a polyimide derivative, may be utilized. The first one of the series of dielectric layers may be placed using, e.g., a spin-coating process, although any suitable method may be used.

After the first one of the series of dielectric layers has been formed, openings may be made through the first one of the series of dielectric layers by removing portions of the first one of the series of dielectric layers. The openings may be formed using a suitable photolithographic mask and etching process, although any suitable process or processes may be used to pattern the first one of the series of dielectric layers.

Once the first one of the series of dielectric layers has been formed and patterned, a first one of the series of conductive layers is formed over the first one of the series of dielectric layers and through the openings formed within the first one of the series of dielectric layers. In an embodiment the first one of the series of conductive layers may be formed by initially forming a seed layer of a titanium copper alloy through a suitable formation process such as CVD or sputtering. A photoresist may then be formed to cover the seed layer, and the photoresist may then be patterned to expose those portions of the seed layer that are located where the first one of the series of conductive layers is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers has been formed, a second one of the series of dielectric layers and a second one of the series of conductive layers may be formed by repeating steps similar to the first one of the series of dielectric layers and the first one of the series of conductive layers. These steps may be repeated as desired in order to electrically connect each of the series of conductive layers to an underlying one of the series of conductive layers, and may be repeated as often as desired until an uppermost one of the series of conductive layers and an uppermost one of the series of dielectric layers has been formed. In an embodiment the deposition and patterning of the series of conductive layers and the series of dielectric layers may be continued until the first redistribution layer has a desired number of layers, although any suitable number of individual layers may be utilized.

Additionally, in yet another embodiment, instead of the first substrate 101 comprising the series of conductive layers and the series of dielectric layers being formed over a support substrate, the series of conductive layers and the series of dielectric layers are, instead, formed over a semiconductor wafer. In such an embodiment the wafer may comprise active and passive devices to provide a desired functionality along with a plurality of metallization layers to interconnect the various active and passive devices. Once the metallization layers have been formed, the series of conductive layers and the series of dielectric layers may be formed in electrical connection with the plurality of metallization layers through, e.g., contact pads.

Once the first substrate 101 is formed, the first module 107, the second module 109, the third module 111, and the fourth module 113 are attached to the first substrate 101. In an embodiment each of the first module 107, the second module 109, the third module 111, and the fourth module 113 are chosen and/or designed in order to work in conjunction with the remainder of the modules in order to obtain the desired functionality. For example, in some embodiments the first module 107, the second module 109, the third module 111, and the fourth module 113 may be each be, independently, a module such as a system on chip (SoC) module, a multilayer ceramic capacitor (MLCC) module, a dynamic random access memory (DRAM) module, an integrated passive device module, or the like. However, any suitable module with any desired functionality may be utilized.

In a very particular embodiment, the first module 107 may be a system on chip module. In such an embodiment the first module 107 may be, for example, a logic device, a central processing unit (CPU), an input/output die, power management integrated circuits, mixed signal integrated circuits, combinations of these, or the like, and may have a first height $H_1$ of between about 30 μm and about 800 μm. However, any suitable functionality and any suitable height may be utilized.

In this same embodiment, the second module 109 may be a passive module that comprises passive devices such as resistors, inductors, capacitors, jumpers, combinations of these, or the like. In a particular embodiment the second module 109 is a capacitor such as a multilayer ceramic capacitor (MLCC) and may have a second height $H_2$ of between about 50 μm and about 1000 μm. However, any suitable passive devices may be utilized.

Continuing with this embodiment, the third module 111 may be another system on chip module. In an embodiment the third module 111 may be similar to the first module 107, but is configured to function in conjunction with the first module 107, and may have a third height $H_3$ of between about 30 μm and about 800 μm. However, any suitable functionality may be utilized.

The fourth module 113 may be a passive device similar to the second module 109. For example, the fourth module 113 may be an integrated passive device, such as an integrated capacitor and may have a fourth height $H_4$ of between about 50 μm and about 1000 μm. However, any suitable functionality may be utilized.

Each of the first module 107, the second module 109, the third module 111, and the fourth module 113 are connected to the first substrate 101 through first external connections 115. In an embodiment each of the first module 107, the second module 109, the third module 111, and the fourth module 113 may comprise the first external connections 115, which in some embodiments is a ball grid array (BGA) which comprises a eutectic material such as solder, although any suitable materials may be used.

In an embodiment in which the first external connections 115 are solder bumps, the first external connections 115 may be formed using a ball drop method, such as a direct ball drop process. In another embodiment, the solder bumps may be formed by initially forming a layer of tin through any suitable method such as evaporation, electroplating, printing, solder transfer, and then performing a reflow in order to shape the material into the desired bump shape with a height of between about 20 μm and about 200 μm. However, any suitable dimensions may be used.

Once the first external connections 115 have been formed (on one or both of the modules and/or the first substrate 101), each of the first module 107, the second module 109, the third module 111, and the fourth module 113 are placed into contact with respective conductive portions of the first substrate 101. In an embodiment the first module 107, the second module 109, the third module 111, and the fourth module 113 may each be placed into physical contact with the first substrate 101 using, e.g., a pick and place process. However, any suitable process may be utilized to place the first module 107, the second module 109, the third module 111, and the fourth module 113 into physical and electrical contact with the first substrate 101.

Once the first module 107, the second module 109, the third module 111, and the fourth module 113 have been placed into contact, a bonding is performed. For example, in an embodiment in which the first external connections 115 are solder bumps, the bonding process may comprise a reflow process whereby the temperature of the first external connections 115 is raised to a point where the first external connections 115 will liquefy and flow, thereby bonding each of the first module 107, the second module 109, the third module 111, and the fourth module 113 once the first external connections 115 resolidifies.

However, while the particular embodiment of the first external connections 115 being solder bumps as a method of bonding has been described, this is intended to be illustrative and is not intended to be limiting. Rather, any suitable type of external connection, such as conductive pillars, and/or any other suitable type of bonding, such as fusion bonding, hybrid bonding, or metal-to-metal bonding, may be used. These and all such types and methods may be utilized to connect the first module 107, the second module 109, the third module 111, and the fourth module 113 to the first substrate 101.

FIG. 1 additionally illustrates a placement of a conductive cube 117 or conductive pillar onto the first substrate 101 in order to provide an electrical connection to complete a topside grounding to a shield 501 (not illustrated in FIG. 1 but illustrated and described further below with respect to FIG. 5A). In an embodiment the conductive cube 117 may be one or more conductive materials, such as copper, silver, aluminum, titanium, or stainless steel although any suitable conductive materials may be utilized.

Additionally, the conductive cube 117 may be sized in order to provide a suitable connection between the first substrate 101 and the shield 501. As such, in some embodiments the conductive cube 117 may have a first width $W_1$ of between about 50 μm and about 500 μm, and may have a first length (not seen in FIG. 1 as the first length extends into and out of the plane of the figure) of between about 50 μm and about 500 μm. However, any suitable dimensions, such as 100 μm, may be utilized.

The conductive cube 117 may additionally have a fifth height $H_5$ that allows for a subsequent removal process to expose the conductive cube 117 after an encapsulation process (not illustrated in FIG. 1 but illustrated and described below with respect to FIG. 2). In some embodiments the conductive cube 117 may have a fifth height $H_5$ of between about 50 μm and about 500 μm. However, any suitable height, such as 100 μm, may be utilized.

To bond the conductive cube 117 to the first substrate 101, a second external connections 119 may be utilized. In this embodiment the second external connections 119 may be a solder material, such as a solder paste or an oxygen solder protection (OSP), although any suitable material may be utilized. In an embodiment the second external connections 119 may be applied using a stencil printing method, a jet printing method, or a syringe, although any suitable method of application may be utilized, and then reflowed.

Once the second external connections 119 have been formed (on one or both of the conductive cube 117 and/or the first substrate 101), the conductive cube 117 is placed into contact with respective conductive portions of the first substrate 101. In an embodiment the conductive cube 117 may each be placed into physical contact with the second external connections 119 using, e.g., a pick and place process. However, any suitable process may be utilized to place the conductive cube 117 into electrical contact with the first substrate 101.

Once the conductive cube 117 has been placed into contact, a bonding is performed. For example, in an embodiment in which the second external connection 119 is a solder paste, the bonding process may comprise a reflow process whereby the temperature of the second external connections 119 is raised to a point where the second external connections 119 will liquefy and flow, thereby bonding the conductive cube 117 and the first substrate once the second external connections 119 resolidifies.

Figure 2:
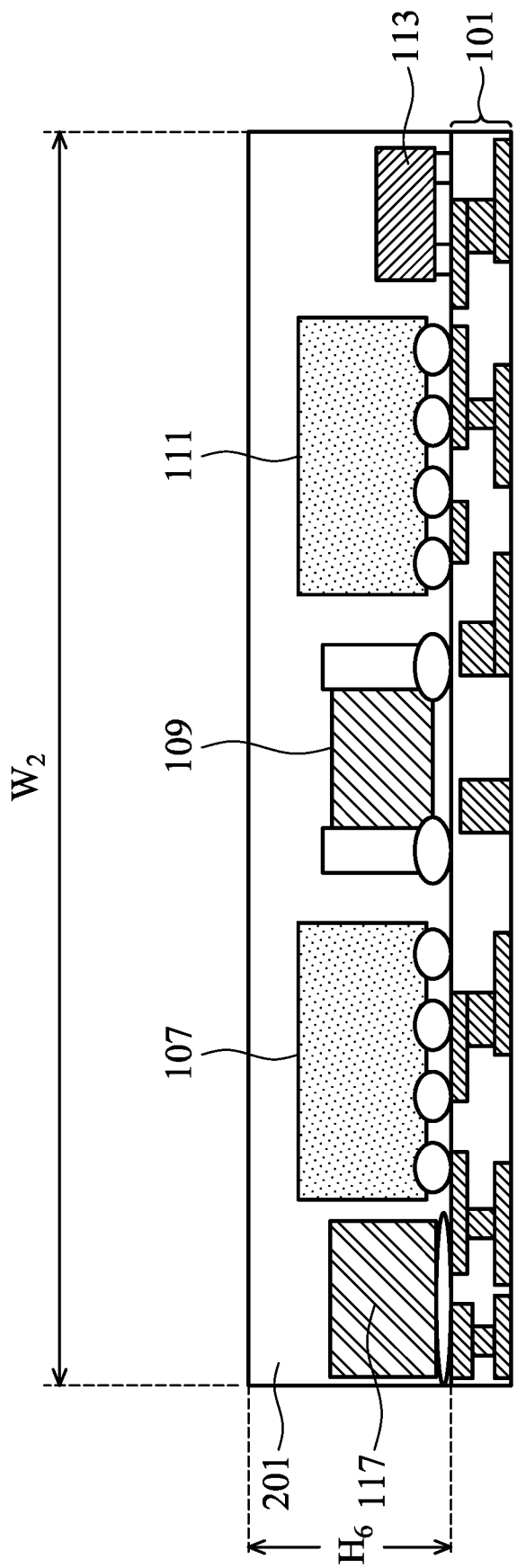
FIG. 2 illustrates an encapsulation process in accordance with some embodiments.

FIG. 2 illustrates an encapsulation of the conductive cube 117, the first module 107, the second module 109, the third module 111, and the fourth module 113. The encapsulation may be performed in a molding device, which may comprise a top molding portion and a bottom molding portion separable from the top molding portion. When the top molding portion is lowered to be adjacent to the bottom molding portion, a molding cavity may be formed for the first substrate 101, the conductive cube 117, and first module 107, the second module 109, the third module 111, and the fourth module 113.

During the encapsulation process the top molding portion may be placed adjacent to the bottom molding portion, thereby enclosing the first substrate 101, the conductive cube 117, and first module 107, the second module 109, the third module 111, and the fourth module 113 within the molding cavity. Once enclosed, the top molding portion and the bottom molding portion may form an airtight seal in order to control the influx and outflux of gasses from the molding cavity. Once sealed, an encapsulant 201 may be placed within the molding cavity.

The encapsulant 201 may be an epoxy or a molding compound resin such as polyimide, polyphenylene sulfide (PPS), polyetheretherketone (PEEK), poly ether sulphone (PES), a heat resistant crystal resin, combinations of these, or the like. The encapsulant 201 may be placed within the molding cavity prior to the alignment of the top molding portion and the bottom molding portion, or else may be injected into the molding cavity through an injection port, using compression molding, transfer molding, or the like.

Once the encapsulant 201 is placed into the molding cavity such that the encapsulant 201 encapsulates the first substrate 101, the conductive cube 117, and first module 107, the second module 109, the third module 111, and the fourth module 113, the encapsulant 201 may be cured in order to harden the encapsulant 201 for optimum protection. While the exact curing process is dependent at least in part on the particular material chosen for the encapsulant 201, in an embodiment in which molding compound is chosen as the encapsulant 201, the curing could occur through a process such as heating the encapsulant 201 to between about 100° C. and about 200° C., such as about 125° C. for about 60 sec to about 3000 sec, such as about 600 sec. Additionally, initiators and/or catalysts may be included within the encapsulant 201 to better control the curing process.

However, as one having ordinary skill in the art will recognize, the curing process described above is merely an exemplary process and is not meant to limit the current embodiments. Other curing processes, such as irradiation or even allowing the encapsulant 201 to harden at ambient temperature, may also be used. Any suitable curing process may be used, and all such processes are fully intended to be included within the scope of the embodiments discussed herein.

In an embodiment the encapsulant 201 may be placed to have a sixth height $H_6$ that is larger than the first height $H_1$, the second height $H_2$, the third height $H_3$, the fourth height $H_4$, and the fifth height $H_5$. As such the sixth height $H_6$ is sufficient, without grinding, to protect each of the conductive cube 117, the first module 107, the second module 109, the third module 111, and the fourth module 113 while still being thin enough so that the conductive cube 117 can be exposed during a subsequent process step without grinding the encapsulant 201. As such, in some embodiments the sixth height $H_6$ may be between about 100 μm and about 1,000 μm.

Additionally, the encapsulant 201 may be formed to have a second width $W_2$ that is greater than the first width $W_1$ of the conductive cube 117 and is also sufficient to cover each of the conductive cube 117, the first module 107, the second module 109, the third module 111, and the fourth module 113. In some embodiments the second width $W_2$ may be between about 3 mm and about 80 mm. However, any suitable dimension may be utilized.

Figure 3:
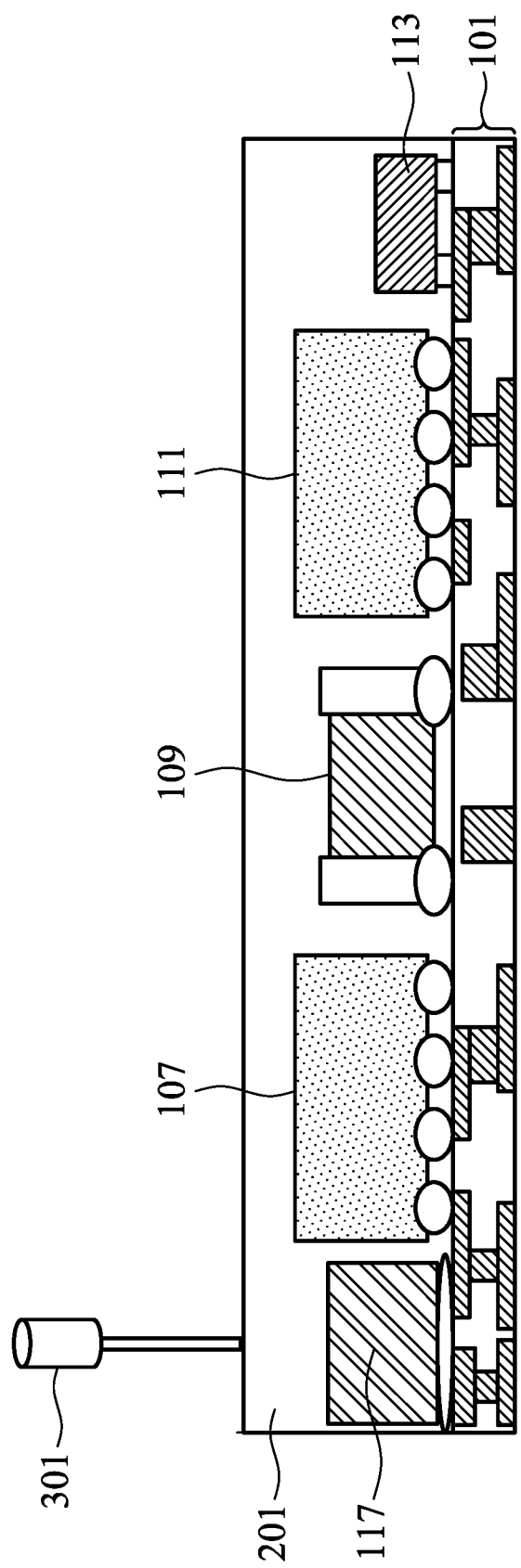
FIG. 3 illustrates placement of the encapsulant for a laser process in accordance with some embodiments.

FIG. 3 illustrates placement of the first substrate 101 and, hence, the encapsulant 201, into a processing system with a laser 301. In an embodiment the laser is utilized to form a first opening 401 (not illustrated in FIG. 3 but illustrated and described below with respect to FIG. 4) through the encapsulant 201 to expose the conductive cube 117. In an embodiment the first substrate 101 and the laser 301 may be positioned such that the laser is directed towards the encapsulant 201 at a drill angle of between about 0 degrees (e.g., perpendicular to the encapsulant 201) to about 85 degrees to normal of the encapsulant 201. Additionally, the laser 301 may be set to have a laser drill power of between about 1 W and about 100 W. However, any suitable parameters may be set.

Figure 4:
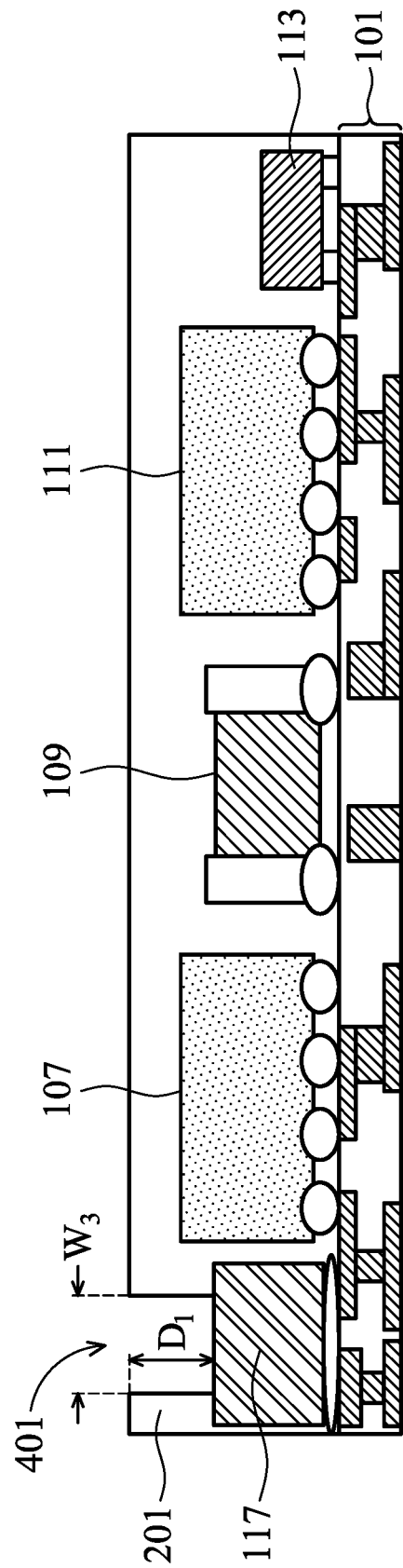
FIG. 4 illustrates formation of an opening through the encapsulant in accordance with some embodiments.

FIG. 4 illustrates the resulting formation of the first opening 401 from the laser drilling process. In an embodiment the first opening 401 extends through the encapsulant 201 to expose the conductive cube 117. In particular embodiments the first opening 401 may be formed to have a third width $W_3$ that is less than the first width $W_1$ of the conductive cube 117 (e.g., $W_3/W_1 < 1$, such as by being between about 0.1 and about 0.9). Additionally, the first opening 401 extends through the encapsulant 201 a first depth $D_1$ of between about 10 μm and about 1950 μm. However, any suitable dimensions may be utilized.

The first opening 401 may also be formed in order to ensure that subsequent deposition processes to form the shield 501 (not illustrated in FIG. 4 but illustrated and described further below with respect to FIG. 5A) has sufficient coverage within the first opening 401. For example, in embodiments in which the shield 501 is formed using a physical vapor deposition process such as sputtering, a ratio of the third width $W_3$ of the first opening 401 to the first depth $D_1$ of the first opening 401 may be between about 4.5 and about 0.3. However, any suitable ratio may be utilized.

Additionally, while a laser drilling process has been used to describe one particular embodiment of forming the first opening 401, this is intended to be illustrative and is not intended to be limiting. Rather, any suitable methods of forming the first opening 401 may be utilized, such as by utilizing a photolithographic masking and etching process. All such methods are fully intended to be included within the scope of the embodiments.

Figure 5A:
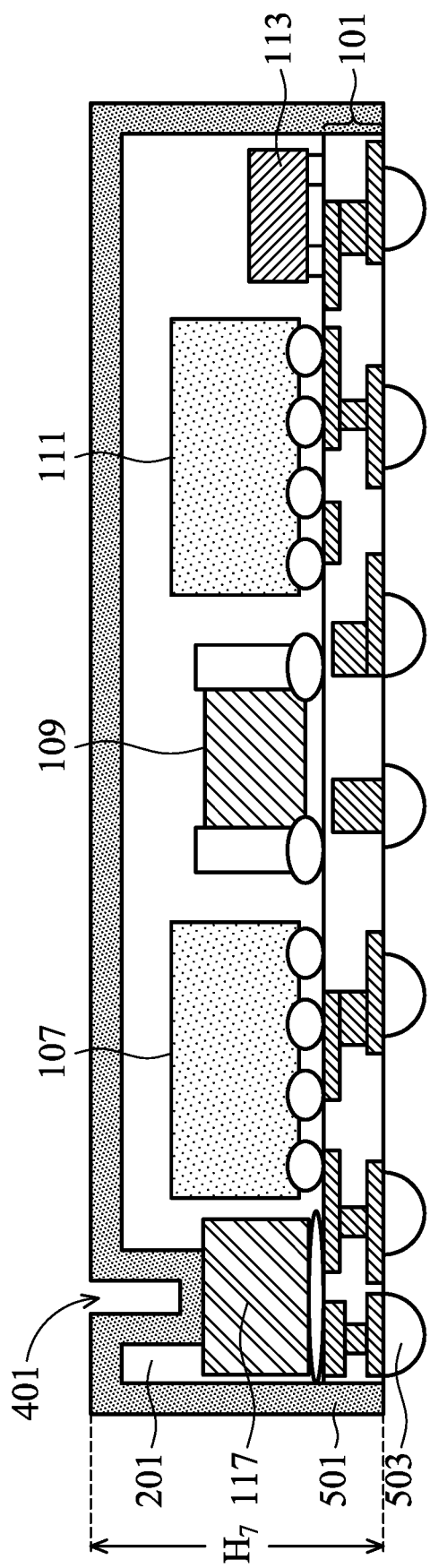
FIGS. 5A-5B illustrate deposition of a shield in accordance with some embodiments.

FIG. 5A illustrates formation of the shield 501 over the encapsulant 201 and along sidewalls of the encapsulant 201 but also extending through the encapsulant 201 to make physical and electrical connection with the conductive cube 117. In an embodiment the shield 501 may be a tri-layer shield comprising a first conductive material, a second conductive material, and a third conductive material. However, any suitable number of layers, such as a single layer of material or four or more layers of material, may be utilized.

In an embodiment the first conductive material may be a conductive material such as stainless steel, copper, titanium, platinum, nickel, silver, combinations of these, or the like. The first conductive material may be deposited using a method such as physical vapor deposition (e.g., sputtering), chemical vapor deposition, combinations of these, or the like, to a thickness of between about 0.01 μm and about 10 μm. However, any suitable material, thickness, and method of deposition may be utilized.

The second conductive material may be formed over the first conductive material and may comprise a material different from the first conductive material, such as copper, stainless steel, titanium, platinum, nickel, silver, combinations of these, or the like. The second conductive material may be deposited using physical vapor deposition (e.g., sputtering), chemical vapor deposition, electroplating, electroless plating, combinations of these, or the like to a thickness of between about 0.01 µm and about 10 µm. However, any suitable material, thickness, and method of manufacture may be utilized.

The third conductive material may be formed over the second conductive material and may comprise a material different from the second conductive material, such as stainless steel, copper, titanium, platinum, nickel, silver, combinations of these, or the like. The third conductive material may be deposited using physical vapor deposition (e.g., sputtering), chemical vapor deposition, combinations of these, or the like to a thickness of between about 0.01 µm and about 10 µm. However, any suitable material, thickness, and method of manufacture may be utilized.

Once the shield 501 has been deposited, the overall structure may have a thickness that is less than may be achievable using other technologies. For example, in some embodiments the overall structure may have a seventh height $H_7$ of between about 50 µm and about 2000 µm. However, any suitable height may be utilized.

FIG. 5A additionally illustrates the placement of second external connectors 503 on an opposite side of the first substrate 101 from the conductive cube 117. In an embodiment the second external connectors 503 may be solder balls such as a ball grid array (BGA) which comprises a eutectic material such as solder, although any suitable materials may be used. In an embodiment in which the second external connectors 503 are solder bumps, the second external connectors 503 may be formed using a ball drop method, such as a direct ball drop process. In another embodiment, the solder bumps may be formed by initially forming a layer of tin through any suitable method such as evaporation, electroplating, printing, solder transfer, and then performing a reflow in order to shape the material into the desired bump shape which has a height of between about 20 µm and about 200 µm.

Figure 5B:
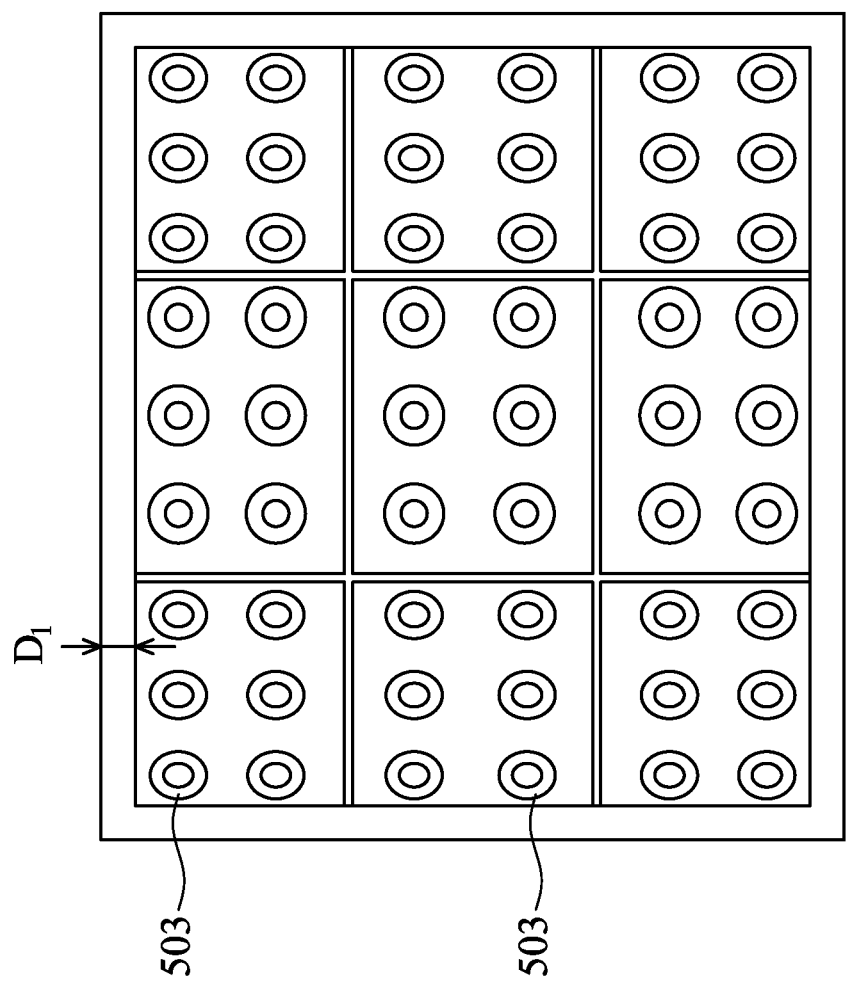

FIG. 5B illustrates a plan view of the second external connectors 503 and helps to illustrate one of the benefits of utilizing the conductive cube 117. By utilizing the conductive cube 117 to make the electrical connection to the shield 501, the shield 501 does not need to be formed such that it is physically located along an opposite side of the first substrate 101 from the first module 107 just in order to be electrically connected to the first substrate 101. As such, specialized equipment that is specially designed to be able to accept the presence of the shield 501 along the backside of the first substrate 101 can be removed, thereby saving money and making the manufacturing process simpler and more cost effective.

Additionally, by removing the shield 501 from the backside of the first substrate 101, keep out zones (KOZ) that are designed in order to allow for space for the shield 501 can be reduced. For example, the keep out zone 505 illustrated in FIG. 5B is that area from the edge of the structure to the first of the second external connectors 503, or the area in which the second external connectors 503 are kept out of. In an embodiment the keep out zone 505 may extend from the edge of the structure inwards for a first distance $D_1$ of between about 10 µm and about 1950 µm. However, any suitable distance may be utilized.

As such, by using the conductive cube 117 (which has a low cost) along with the pick and place process (which also has a low cost), the overall costs for connecting the shield 501 to ground can be lowered. Additionally, a thinner device can be achieved using the conductive cube 117 than using either metal lids by themselves or else using methods that require a backside or lateral side grounding methods which can impact yield loss. This becomes even more cost effective when specialized structures such as the tray can be both removed (even further lowering costs) while simultaneously reducing the keep out zone to allow for even further use of the surface area of the structure. All such improvements help to lower the cost and size of the device.

Figure 6:
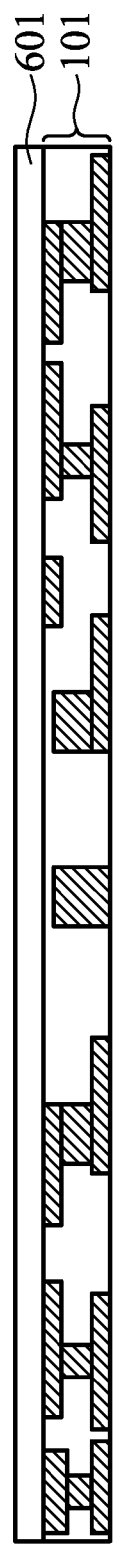
FIG. 6 illustrates deposition of a seed layer in accordance with some embodiments.

FIG. 6 illustrates another process whereby, instead of using the conductive cube 117, a conductive pillar 801 (not illustrated in FIG. 6 but illustrated and described below with respect to FIG. 8) is instead formed on the first substrate 101. In an embodiment the formation of the conductive pillar 801 may be initiated by first forming a first seed layer 601 over the first substrate 101. The first seed layer 601 is formed over the first substrate 101, and is a thin layer of a conductive material that aids in the formation of a thicker layer during subsequent processing steps. The first seed layer 601 may comprise a layer of titanium followed by a layer of copper. The first seed layer 601 may be created using processes such as sputtering, evaporation, or PECVD processes, depending upon the desired materials. The first seed layer 601 may be formed to have a thickness of between about 0.5 µm and about 5 µm. However, any suitable thickness may be used.

Figure 7:
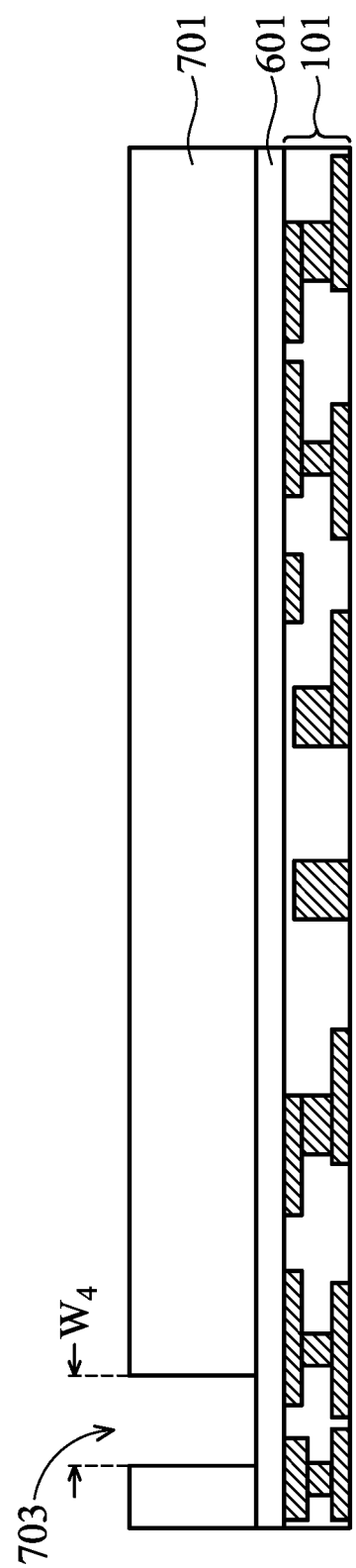
FIG. 7 illustrates a deposition and patterning of a photoresist layer in accordance with some embodiments.

FIG. 7 illustrates that, once the first seed layer 601 has been formed, a photoresist 701 is placed and patterned over the first seed layer 601. In an embodiment the photoresist 701 may be a wet film photoresist or a dry film photoresist. In embodiments in which the photoresist 701 is a wet film photoresist, the photoresist 701 may be placed on the first seed layer 601 using, e.g., a spin coating technique to a height of between about 75 µm and about 550 µm. Once in place, the photoresist 701 may then be patterned by exposing the photoresist 701 to a patterned energy source (e.g., a patterned light source) so as to induce a chemical reaction, thereby inducing a physical change in those portions of the photoresist 701 exposed to the patterned light source. A developer is then applied to the exposed photoresist 701 to take advantage of the physical changes and selectively remove either the exposed portion of the photoresist 701 or the unexposed portion of the photoresist 701, depending upon the desired pattern, to form a second opening 703.

In an embodiment the second opening 703 formed into the photoresist 701 is a pattern for the conductive pillar 801. In an embodiment the second opening 703 may be formed to have a fourth width $W_4$ of between about 50 µm and about 500 µm. However, any suitable dimension, such as 100 µm, may be utilized.

Figure 8:
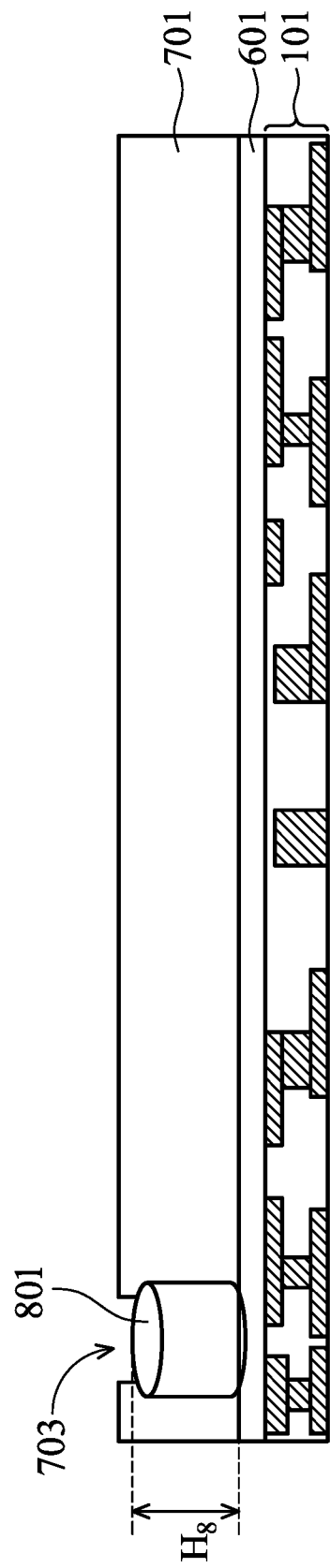
FIG. 8 illustrates a formation of the conductive connector with the seed layer in accordance with some embodiments.

FIG. 8 illustrates a formation of the conductive pillar 801 within the second opening 703 of the photoresist 701. In an embodiment the conductive pillar 801 is formed within the photoresist 701 and comprises one or more conductive materials, such as copper, tungsten, other conductive metals, or the like. The conductive pillar 801 may be formed, for example, by electroplating, electroless plating, or the like. In an embodiment, an electroplating process is used wherein the first seed layer 601 and the photoresist 701 are submerged or immersed in an electroplating solution. The first seed layer 601 surface is electrically connected to the negative side of an external DC power supply such that the first seed layer 601 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 601, acquires the dissolved atoms, thereby plating the exposed conductive areas of the first seed layer 601 within the second opening 703 of the photoresist 701.

In an embodiment the conductive pillar 801 may be formed in the shape of the second opening 703 and, as such, has the fourth width $W_4$. Additionally, the conductive pillar 801 may be formed to have an eighth height $H_8$ that allows for subsequent connection to the shield 501 but which is still less than the height of the subsequently applied encapsulant 201 (e.g., the sixth height $H_6$). In an embodiment the eighth height $H_8$ may be between about 60 µm and about 2000 µm. However, any suitable dimension may be utilized.

Figure 9:
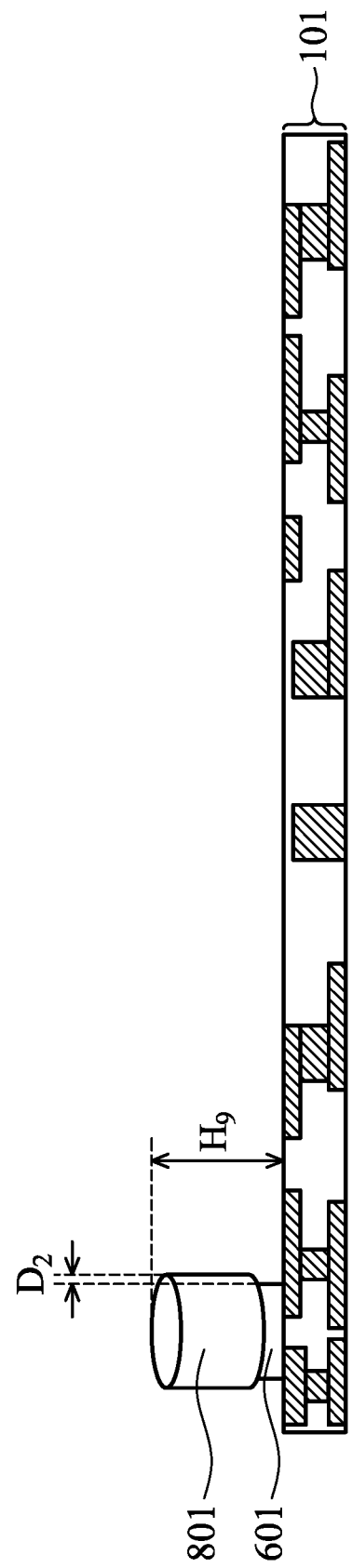
FIG. 9 illustrates a removal of the photoresist in accordance with some embodiments.

FIG. 9 illustrates that, once the conductive pillar 801 has been formed using the photoresist 701 and the first seed layer 601, the photoresist 701 may be removed using a suitable removal process. In an embodiment, a plasma ashing process may be used to remove the photoresist 701, whereby the temperature of the photoresist 701 may be increased until the photoresist 701 experiences a thermal decomposition and may be removed. However, any other suitable process, such as a wet strip, may be utilized. The removal of the photoresist 701 may expose the underlying portions of the first seed layer 601.

Once exposed, a removal of the exposed portions of the first seed layer 601 may be performed. In an embodiment the exposed portions of the first seed layer 601 (e.g., those portions that are not covered by the conductive pillar 801) may be removed by, for example, a wet or dry etching process. For example, in a dry etching process reactants may be directed towards the first seed layer 601 using the conductive pillar 801 as masks. In another embodiment in which a wet etching process is utilized, etchants may be sprayed or otherwise put into contact with the first seed layer 601 in order to remove the exposed portions of the first seed layer 601. After the exposed portion of the first seed layer 601 has been etched away, portions of the first substrate 101 are exposed.

Additionally, in embodiments in which a wet etch process is utilized, the wet etching process may not only remove those portions of the first seed layer 601 which are exposed by the conductive pillar 801, but may also etch a portion of the first seed layer 601 that is covered by the conductive pillar 801. As such, the wet etch process may actually recess the first seed layer 601 away from sidewalls of the conductive pillar 801 and undercut the conductive pillar 801. In a particular embodiment the first seed layer 601 may be recessed a second distance $D_2$ of between about 0.01 µm and about 1 µm. However, any suitable distance may be utilized.

After the removal of the exposed portions of the first seed layer 601, the combination of the first seed layer 601 and the conductive pillar 801 may have a ninth height $H_9$ of between about 40 µm and about 1990 µm. However, any suitable height may be utilized.

Figure 10:
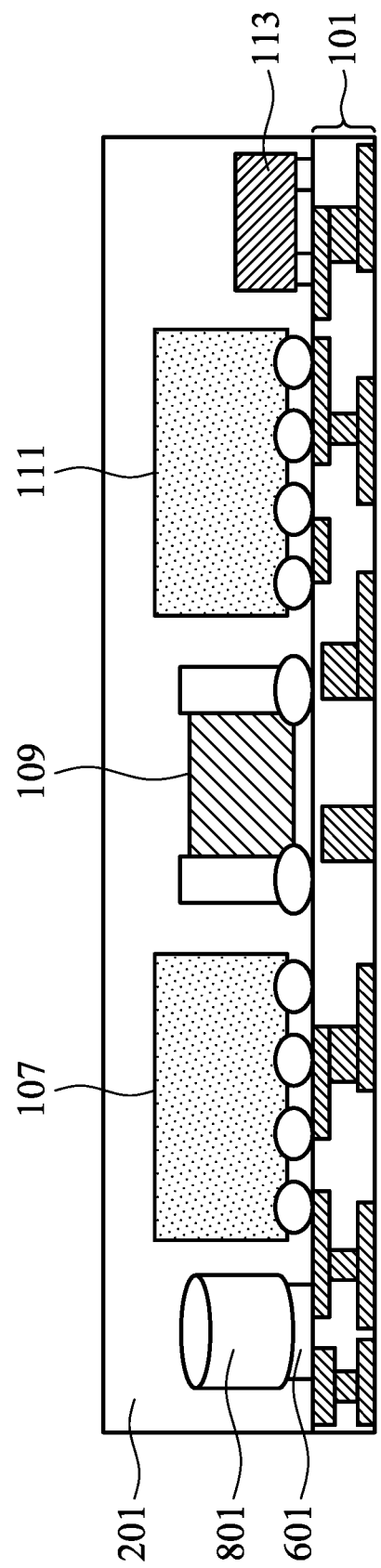
FIG. 10 illustrates an encapsulation process in accordance with some embodiments.

FIG. 10 illustrates a placement of the first module 107, the second module 109, the third module 111, and the fourth module 113 onto the first substrate 101 after the formation of the conductive pillar 801. In an embodiment the placement of the first module 107, the second module 109, the third module 111, and the fourth module 113 may be performed as described above with respect to FIG. 1. For example, each of the first module 107, the second module 109, the third module 111, and the fourth module 113 may be placed using, e.g., a pick and place process, and then the first module 107, the second module 109, the third module 111, and the fourth module 113 may be bonded to the first substrate 101 using, e.g., a reflow process.

FIG. 10 additionally illustrates a placement of the encapsulant 201 around the first module 107, the second module 109, the third module 111, the fourth module 113, and the conductive pillar 801. In an embodiment the encapsulant 201 may be placed as described above with respect to FIG. 2. However, any suitable method of placing the encapsulant 201 may be utilized.

Figure 11:
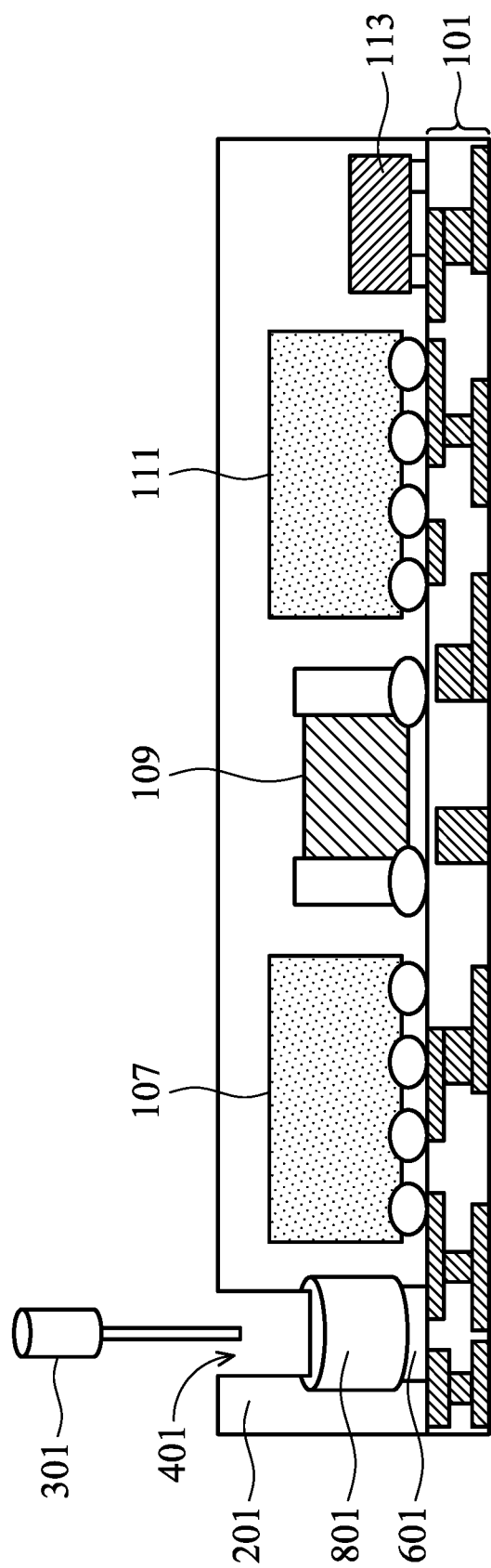
FIG. 11 illustrates formation of an opening in accordance with some embodiments.

FIG. 11 illustrates a formation of the first opening 401 through the encapsulant 201 to expose the conductive pillar 801. In an embodiment the first opening 401 may be formed as described above with respect to FIG. 4, such as by using a laser drilling process to remove material of the encapsulant 201 until the conductive pillar 801 is exposed. However, any suitable method of forming the first opening 401 may be utilized.

Figure 12:
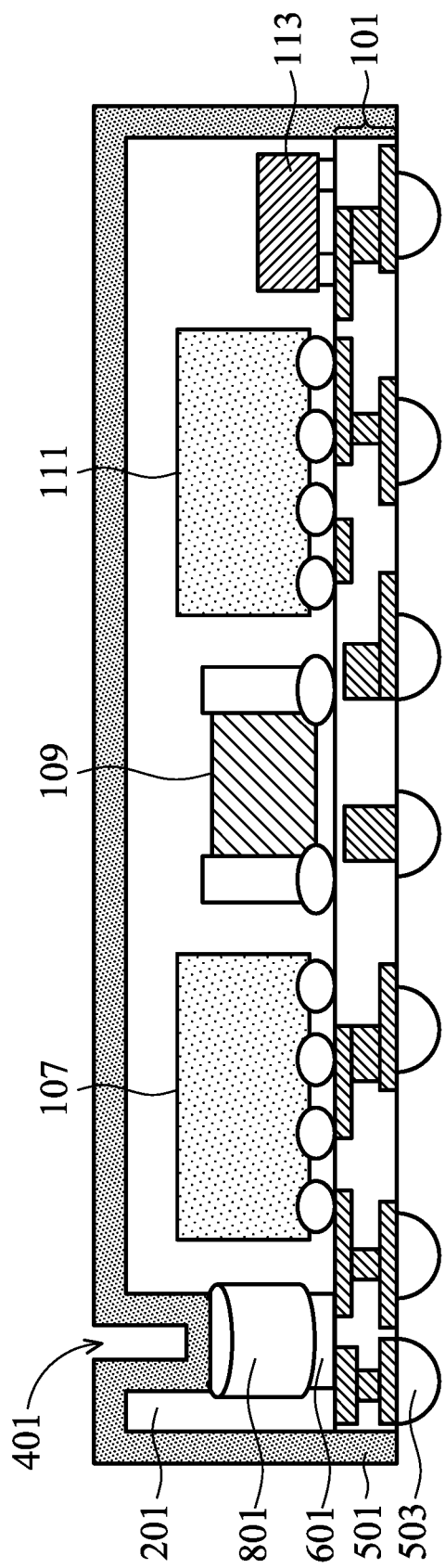
FIG. 12 illustrates a deposition of the shield in accordance with some embodiments.

FIG. 12 illustrates a deposition of the shield 501 over and through the encapsulant 201 to make physical and electrical connection with the conductive pillar 801, and a placement of the second external connectors 503. In an embodiment the shield 501 may be formed and the second external connectors 503 may be placed as described above with respect to FIG. 5A. For example, a series of conductive materials (e.g., a tri-layer of stainless steel, copper, and stainless steel) may be deposited over and through the encapsulant 201. However, any suitable materials and methods may be utilized.

By utilizing the lithographic placement and plating process described within FIGS. 6-12, the size and position of the conductive pillar 801 can be easily controlled. Additionally, by controlling the size of the first opening 401, a good sputter coverage rate during the deposition of the shield 501 may be obtained. As such, the shield 501 may be obtained without the use of other technologies such as backside or lateral side grinding which can impact yield or a shield without encapsulation which may be too fragile. As such, the overall device can be thinned using low costs processes without impacting yield.

In accordance with an embodiment, a semiconductor device includes: a redistribution substrate; a plurality of modules on a first side of the redistribution substrate, the plurality of modules being interconnected through the redistribution substrate; a conductive connector on the first side of the redistribution substrate; and an encapsulant encapsulating the conductive connector and the plurality of modules, the encapsulant extending over a second side of the conductive connector, the second side facing away from the redistribution substrate; and a shield extending through the encapsulant to make physical contact with the conductive connector. In an embodiment the conductive connector is a conductive pillar. In an embodiment the conductive connector is connected to the redistribution substrate through a seed layer. In an embodiment the conductive connector is connected to the redistribution substrate through a solder paste. In an embodiment a first one of the plurality of modules is a system on chip module. In an embodiment a second one of the plurality of modules is an integrated passive device. In an embodiment the conductive connector is a conductive cube.

In accordance with another embodiment, a semiconductor device includes: a conductive connector, the conductive connector having a first height; a redistribution substrate in electrical connection with the conductive connector; an encapsulant over the redistribution substrate, the encapsulant extending away from the redistribution substrate a first distance larger than the first height; a first module embedded in the encapsulant and electrically connected to the redistribution substrate, the first module having a second height less than the first distance; a second module embedded in the encapsulant; and a shield extending through the encapsulant to make physical contact with the conductive connector and also extending along a top surface of the encapsulant to be located over the first module and the second module. In an embodiment the shield extends along a sidewall of the encapsulant, the sidewall being at a right angle to the top surface. In an embodiment the semiconductor device further includes a seed layer located between the conductive connector and the redistribution substrate. In an embodiment the seed layer is recessed away from a sidewall of the conductive connector. In an embodiment the semiconductor device further includes a solder paste located between the conductive connector and the redistribution substrate. In an embodiment the conductive connector is a copper cube. In an embodiment the conductive connector is a copper pillar.

In accordance with yet another embodiment, a method of manufacturing a semiconductor device, the method including: placing a plurality of modules onto a substrate; depositing a conductive connector onto the substrate; encapsulating the conductive connector and the plurality of modules with an encapsulant; forming an opening through the encapsulant to expose at least a portion of the conductive connector; and depositing a shield layer over the encapsulant and in the opening to make electrical connection with the conductive connector. In an embodiment the depositing the shield layer is performed prior to any grinding of the encapsulant. In an embodiment the placing the conductive connector comprises a pick and place process. In an embodiment the placing the conductive connector further includes: depositing a seed layer; patterning a photoresist over the seed layer; and plating the conductive connector onto the seed layer through the photoresist. In an embodiment the method further includes: removing the photoresist; and wet etching the seed layer. In an embodiment the wet etching the seed layer recesses the seed layer away from a sidewall of the conductive connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a redistribution substrate, the redistribution substrate comprising sidewalls of a dielectric material, the dielectric material extending from a first side of the redistribution substrate to a second side of the redistribution substrate opposite the first side;
    placing a plurality of modules on a first side of the redistribution substrate, the plurality of modules being interconnected through the redistribution substrate, wherein the plurality of modules comprises a first system on chip module, a passive module, a second system on chip module, and an integrated passive device;
    placing a conductive connector on the first side of the redistribution substrate;
    encapsulating the conductive connector and the plurality of modules with an encapsulant, the encapsulant extending over a second side of the conductive connector, the second side facing away from the redistribution substrate; and
    placing a shield through the encapsulant to make physical contact with the conductive connector, wherein the shield located below a topmost surface of the encapsulant forms a "U"-shape, wherein the shield covers the dielectric material from a first side of the redistribution substrate to a second side of the redistribution substrate.

2. The method of claim 1, wherein the conductive connector is a conductive pillar.

3. The method of claim 2, wherein placing the conductive connector comprises forming a seed layer.

4. The method of claim 2, wherein placing the conductive connector comprises placing a solder paste.

5. The method of claim 1, wherein the first system on chip module is adjacent to the conductive connector after the placing the conductive connector.

6. The method of claim 5, wherein the integrated passive device is adjacent to the first system on chip module.

7. The method of claim 1, wherein the conductive connector is a conductive cube.

8. A method of manufacturing a semiconductor device, the method comprising:
    forming a redistribution substrate;
    forming a conductive connector in electrical connection with the redistribution substrate, the conductive connector having a first height, a first width, and a first length, the first height being between about 50 µm and about 500 µm, the first width being between about 50 µm and about 500 µm, and the first length being between about 50 µm and about 500 µm;
    placing an encapsulant over the redistribution substrate, the encapsulant extending away from the redistribution substrate a first distance larger than the first height, wherein a first module, a second module, a third module, and a fourth module are embedded in the encapsulant and electrically connected to the redistribution substrate, wherein the first module has a first module height of between about 30 µm and about 800 µm, the second module has a second module height of between about 50 µm and about 1000 µm, the second module height being less than the first module height, the third module has a third module height of between about 30 µm and about 800 µm, the third module height being greater than the second module height, and the fourth module has a fourth module height of between about 50 µm and about 1000 µm, the fourth module height being less than the first module height, the second module height, and the third module height; and
    placing a shield extending through the encapsulant to make physical contact with the conductive connector and also extending along a top surface of the encapsulant to be located over the first module and the second module.

9. The method of claim 8, wherein placing the shield places the shield along a sidewall of the encapsulant, the sidewall being at a right angle to the top surface.

10. The method of claim 8, wherein forming the conductive connector further comprising forming a seed layer adjacent to the redistribution substrate.

11. The method of claim 10, further comprising recessing the seed layer from a sidewall of the conductive connector.

12. The method of claim 8, further comprising placing a solder paste adjacent to the redistribution substrate prior to forming the conductive connector.

13. The method of claim 8, wherein the conductive connector is a copper cube.

14. The method of claim 8, wherein the conductive connector is a copper pillar.

15. A method of manufacturing a semiconductor device, the method comprising:
   placing a plurality of modules onto a substrate, wherein the placing the plurality of modules includes a first system on chip module, a passive module, a second system on chip module, and an integrated passive device;
   placing a conductive connector onto the substrate;
   encapsulating the conductive connector and the plurality of modules with an encapsulant;
   forming an opening through the encapsulant to expose at least a portion of the conductive connector; and
   depositing a shield layer over the encapsulant and in the opening to make electrical connection with the conductive connector, the shield layer fully covering sidewalls of the substrate, wherein each portion of the sidewalls of the substrate in physical contact with the shield layer is a dielectric material, wherein a height from a side of the substrate opposite the plurality of modules to a side of the shield layer facing away from the encapsulant and over the encapsulant is between about 50 μm and about 2,000 μm.

16. The method of claim 15, wherein depositing the shield layer is performed prior to any grinding of the encapsulant.

17. The method of claim 15, wherein placing the conductive connector comprises a pick and place process.

18. The method of claim 15, wherein placing the conductive connector further comprises:
   depositing a seed layer;
   patterning a photoresist over the seed layer; and
   plating the conductive connector onto the seed layer through the photoresist.

19. The method of claim 18, further comprising:
   removing the photoresist; and
   wet etching the seed layer.

20. The method of claim 19, wherein the wet etching the seed layer recesses the seed layer away from a sidewall of the conductive connector.

\* \* \* \* \*